US006800417B2

(12) United States Patent
Kikuchi

(10) Patent No.: US 6,800,417 B2
(45) Date of Patent: Oct. 5, 2004

(54) LITHOGRAPHIC PRINTING PLATE PRECURSOR

(75) Inventor: Kei Kikuchi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 23 days.

(21) Appl. No.: 10/252,418

(22) Filed: Sep. 24, 2002

(65) Prior Publication Data

US 2003/0162127 A1 Aug. 28, 2003

(30) Foreign Application Priority Data

Sep. 28, 2001 (JP) .................................... P. 2001-301796

(51) Int. Cl.[7] ............................ G03F 7/028; G03F 7/11

(52) U.S. Cl. ................................ 430/270.1; 430/278.1; 430/281.1; 430/286.1; 430/302; 430/309; 430/434; 430/494; 430/944; 430/945

(58) Field of Search ........................... 430/270.1, 271.1, 430/278.1, 281.1, 286.1, 964, 302, 309, 434, 494, 944, 945

(56) References Cited

U.S. PATENT DOCUMENTS

| | | | | | |
|---|---|---|---|---|---|
| 3,136,636 | A | | 6/1964 | Dowdall et al. | |
| 4,483,913 | A | | 11/1984 | Eklund et al. | |
| 6,508,170 | B2 | * | 1/2003 | Katsuoka et al. | 101/455 |
| 6,576,401 | B2 | * | 6/2003 | Teng | 430/303 |
| 6,623,910 | B2 | * | 9/2003 | Shimada et al. | 430/270.1 |
| 2003/0022094 | A1 | * | 1/2003 | Nakamura et al. | 430/157 |
| 2003/0073033 | A1 | * | 4/2003 | Kawamura et al. | 430/271.1 |

FOREIGN PATENT DOCUMENTS

EP 1 110 747 A1 * 6/2001 ............ B41N/3/08

* cited by examiner

*Primary Examiner*—Barbara Gilliam
(74) *Attorney, Agent, or Firm*—Sughrue Mion, PLLC

(57) ABSTRACT

A lithographic printing plate precursor comprising: an aluminum support; an interlayer; and a photosensitive layer in this order, wherein the aluminum support is surface-roughened and has an anodic oxide coating, the interlayer comprises a compound comprising a di- or more valent metal element, and the photosensitive layer comprises an infrared absorbent, a radical generator and a radical polymerizable compound.

13 Claims, No Drawings

LITHOGRAPHIC PRINTING PLATE PRECURSOR

FIELD OF THE INVENTION

The present invention relates to a lithographic printing plate precursor for use in the negative-type image recording, more specifically, the present invention relates to a lithographic printing plate precursor capable of so-called direct plate-making where a printing plate can be produced directly from digital signals of a computer or the like by using an infrared laser.

BACKGROUND OF THE INVENTION

Conventionally, a negative-type photosensitive lithographic printing plate widely used is obtained by providing a negative-type photosensitive layer containing a diazo compound on an aluminum support subjected to a surface-roughening treatment, an alkali etching or an anodization treatment. The diazo compound is known to decompose upon exposure to generate an acid and accelerate the crosslinking reaction. When the photosensitive layer is developed with an alkali aqueous solution after image exposure, only the unexposed area is dissolved and removed and the support surface is revealed. The exposed part (image area) works out to an ink-receptive part due to remaining of the lipophilic photosensitive layer and the unexposed part (non-image area) works out to an ink-repellent part by holding water due to revealment of the hydrophilic support surface. However, the aluminum support surface is insufficient in the hydrophilicity and in turn in the ink repellency and this causes a problem that ink adheres to the non-image area (hereinafter called “staining performance”).

Accordingly, the non-image area must be usually rendered hydrophilic so as to improve the staining performance. However, if a negative-type photosensitive layer is provided on a hydrophilized support, the number of sheets which can be normally printed decreases due to poor adhesion between the hydrophilic support surface and the lipophilic photosensitive layer (hereinafter called “impression performance”) . To overcome this problem, usually, only the non-image area is hydrophilized at the development by using a developer containing a silicate such as sodium silicate or potassium silicate. However, use of a developer containing a silicate has a problem, for example, a solid matter ascribable to $SiO_2$ is readily precipitated or in the neutralization for treating the developer waste, a gel ascribable to $SiO_2$ is produced. Therefore, a technique of, even when a negative-type photosensitive layer is provided on an aluminum support, ensuring good adhesion between the support and the photosensitive layer and causing no deterioration of the impression performance has been demanded.

In order to solve these problems, U.S. Pat. No. 3,136,636 discloses a technique of providing an undercoat layer comprising a water-soluble polymer such as polyacrylic acid or carboxymethyl hydroxyethyl cellulose, however, the impression capability is not satisfied. Also, U.S. Pat. No. 4,483,913 discloses a technique of providing an undercoat layer comprising a quaternary ammonium compound such as poly(dimethyldiallylammonium chloride), however, the staining performance is not satisfied.

On the other hand, the laser technique is recently making a remarkable progress and particularly, as for the solid laser and the semiconductor laser of radiating an infrared ray at a wavelength of 760 to 1,200 nm, a high-output and compact laser is easily available. These lasers are very useful as a recording light source at the direct production of a printing plate from digital data of a computer or the like. However, many photosensitive recording materials useful in practice are sensitive to light in the visible light region at a wavelength of 760 nm or less and therefore, image recording cannot be performed with these infrared lasers. Accordingly, a material capable of recording with an infrared laser is being demanded.

SUMMARY OF THE INVENTION

The present invention has been made to overcome those problems in conventional techniques and achieve the following object. The object of the present invention is to provide a lithographic printing plate precursor which can produce a printing plate directly from digital data of a computer or the like by performing the recording using a solid or semiconductor laser of radiating an infrared ray and exhibits good properties in staining performance and impression performance.

As a result of extensive studies, the present inventors have found that the above-described can be attained by incorporating a specific compound into an interlayer between the support and the photosensitive layer (image-forming layer). The present invention has been accomplished based on this finding. Namely, the object of the present invention can be attained by the following lithographic printing plate precursor.

A lithographic printing plate precursor comprising an aluminum support having sequentially provided thereon an interlayer comprising a compound containing a divalent or greater valent metal element, and a photosensitive layer containing an infrared absorbent, a radical generator and a radical polymerizable compound, the aluminum support being surface-roughened and subjected to the formation of an anodic oxide coating (film).

DETAILED DESCRIPTION OF THE INVENTION

The present invention is described in detail below.

The lithographic printing plate precursor of the present invention is obtained by sequentially providing an interlayer comprising a compound containing a divalent or greater valent metal element, and a photosensitive layer containing an infrared absorbent, a radical generator and a radical polymerizable compound, on an aluminum support which is surface-roughened and subjected to the formation of an anodic oxide coating.

[I] Interlayer

In the present invention, an interlayer comprising a compound containing a divalent or greater valent metal element, preferably a di-, tri- or tetra-valent metal element, between the support and the photosensitive layer.

The compound containing a divalent or greater valent metal element, which is contained in the interlayer, indicates a compound containing as a positive component, for example, a metal element belonging to Groups 2, 3, 12 and 13 of the periodic table, preferably beryllium, magnesium, calcium, strontium, barium, zinc, cadmium, mercury, aluminum, gallium, indium, thallium, scandium or yttrium, and as a negative component, halogen element, nitric acid, sulfuric acid, acetic acid, phosphoric acid, hydrochloric acid, iodic acid, carbonic acid, oxygen acid, ethylenediamine tetraacetic acid, hydroxyl group, hydroxo group, hydroxyamino group, alkoxyl group, acetylacetone, or alkyl acetoacetate. Among these, preferred are compounds containing calcium, magnesium, strontium, barium or aluminum as the positive component. These components may be used individually or in combination of two or more thereof.

Specific examples of the compound containing calcium, magnesium, strontium, barium or aluminum as the positive component include calcium fluoride, magnesium fluoride, strontium fluoride, barium fluoride, aluminum fluoride, calcium chloride, magnesium chloride, strontium chloride, barium chloride, aluminum chloride, calcium bromide, magnesium bromide, strontium bromide, barium bromide, aluminum bromide, calcium iodide, magnesium iodide, strontium iodide, barium iodide, aluminum iodide, calcium hydroxide, magnesium hydroxide, strontium hydroxide, barium hydroxide, aluminum hydroxide, calcium nitrate, magnesium nitrate, strontium nitrate, barium nitrate, aluminum nitrate, calcium sulfate, magnesium sulfate, strontium sulfate, barium sulfate, aluminum sulfate, alum, calcium acetate, magnesium acetate, strontium acetate, barium acetate, aluminum acetate, calcium ethylenediaminetetraacetate, magnesium ethylenediaminetetraacetate, strontium ethylenediaminetetraacetate, barium ethylenediaminetetraacetate, calcium phosphate, magnesium phosphate, strontium phosphate, barium phosphate, calcium carbonate, magnesium carbonate, strontium carbonate, barium carbonate, aluminum methylate, aluminum ethylate, aluminum isopropylate, aluminum mono-sec-butoxy diisopropylate, aluminum secbutylate, aluminum ethylacetoacetate diisopropylate, aluminum tris (ethylacetoacetate), aluminum alkylacetoacetate diisopropylate, aluminum monoacetyl-acetonate-bis (ethylacetoacetate), aluminum tris(acetyl-acetonate), aluminum ethylacetoacetate diisopropylate and aluminum tris (ethylacetoacetate).

Method for Forming Interlayer

The interlayer comprising a compound containing divalent or greater valent metal element can be formed by the following method. For examples, a method of dissolving the compound containing a divalent or greater valent metal element in an organic solvent such as methanol, ethanol or methyl ethyl ketone, a mixed solvent thereof or a mixed solvent of the organic solvent with water to prepare an undercoat solution, coating the undercoat solution on a support such as aluminum, and drying it to form the interlayer may be used. Also, a method of dissolving the compound in an organic solvent such as methanol, ethanol or methyl ethyl ketone, a mixed solvent thereof, or a mixed solvent of the organic solvent with water to prepare an undercoat layer-forming solution, dipping a support such as aluminum in the solution, washing the support with water, air or the like, and drying it to provide the interlayer may be used.

In the former method, an undercoat layer-forming solution where the total concentration of the compound containing a divalent or greater valent metal element is from 0.005 to 10 wt % can be coated by various methods. For example, bar coater coating, rotary coating, spray coating, curtain coating or the like may be used. In the latter method, the undercoat layer-forming solution has a concentration of 0.005 to 20 wt %, preferably from 0.01 to 10 wt %, the dipping temperature is from 0 to 70° C., preferably from 5 to 60° C., and the dipping time is from 0.1 second to 5 minutes, preferably from 0.5 to 120 seconds.

The dry coverage of the interlayer is preferably from 5 to 100 $mg/m^2$, more preferably from 10 to 50 $mg/m^2$. If the coverage is less than 5 $mg/m^2$, staining is generated on the non-image area at printing, whereas if it exceeds 100 $mg/m^2$, the adhesive property between the support and the photosensitive layer deteriorates and the number of sheets which can be printed decreases.

[II] Photosensitive Layer

When an infrared laser is irradiated on the printing plate precursor of the present invention, the infrared absorbent in the photosensitive layer absorbs the infrared ray and converts it into heat and by the heat generated, the radical polymerization initiator decomposes and generates a radical. By this radical, the polymerization reaction of the radical polymerizable compound is triggered to form a hardened image.

(1) Infrared Absorbent

The infrared absorbent for use in the present invention is usually a dye or a pigment having an absorption maximum at a wavelength from 760 to 1,200 nm.

As the dye, commercially available dyes and known dyes described in publications, for example, *Senryo Binran* (*Handbook of Dyes*), compiled by Yuki Gosei Kagaku Kyokai (1970), may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt, and metal thiolate complex.

Preferred examples of the dye include cyanine dyes described in JP-A-58-125246 (the term "JP-A" as used herein means an "unexamined published Japanese patent application"), JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, the near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-base compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, and pyrylium compounds described in JP-B-5-13514 (the term "JP-B" as used herein means an "examined Japanese patent publication") and JP-B-5-19702 may also be preferably used.

Other preferred examples of the dye include the near infrared absorbing dyes represented by formulae (I) and (II) of U.S. Pat No. 4,756,993.

Among these dyes, particularly preferred are cyanine dye, squarylium dye, pyrylium salt and nickel thiolate complex, more preferred is cyanine dye, and most preferred is the cyanine dye represented by the following formula (I):

(I)

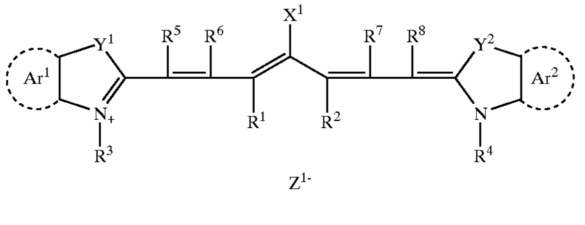

In formula (I), $X^1$ represents a halogen atom or $X^2$—$L^1$, wherein $X^2$ represents an oxygen atom or a sulfur atom and $L^1$ represents a hydrocarbon group having from 1 to 12 carbon atoms. $R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms and $R^1$ and $R^2$ are more preferably combined with each other to form a 5- or 6-membered ring. $Ar^1$ and $Ar^2$ may be the same or different and each represents an aromatic hydrocarbon group which may have a substituent. Preferred examples of the aromatic hydrocarbon group include a benzene ring and a naphthalene ring, and preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the raw material, preferably a hydrogen atom. $Z^{1-}$ represents a counter anion. In the case where a sulfo group is substituted to any one of $R^1$ to $R^8$, $Z^{1-}$ is not necessary. In view of storage stability of the coating solution for the recording layer, $Z^{1-}$ is preferably halide ion, perchlorate ion, tetrafluoroborate ion, hexafluorophosphate ion or sulfonate ion, more preferably perchlorate ion, hexafluorophosphate ion or arylsulfonate ion.

Specific examples ([IR-1] to [IR-12]) of the cyanine dye represented by formula (I), which can be suitably used in the present invention, are set forth below, however, the present invention is not limited thereto.

[IR-1]

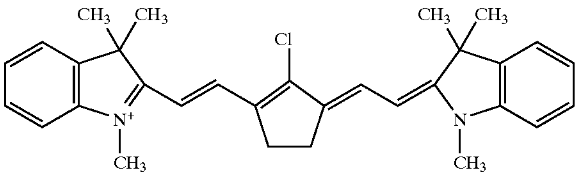

$ClO_4^-$

[IR-2]

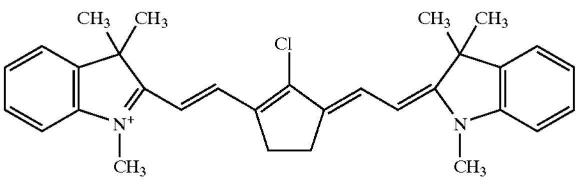

$PF_6^-$

-continued

[IR-3]

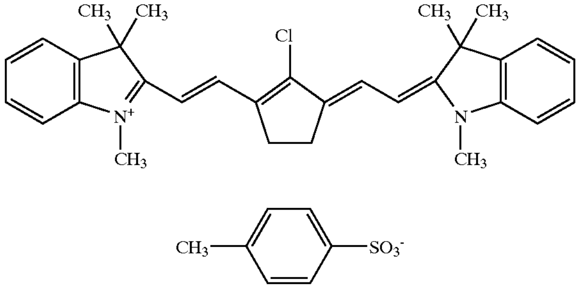

[IR-4]

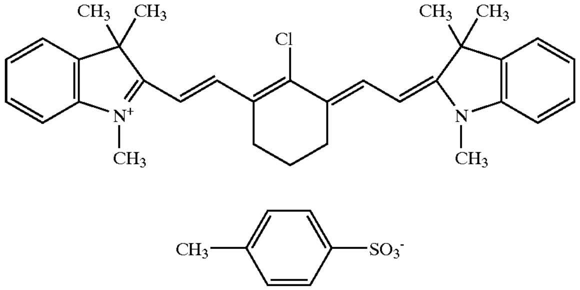

[IR-5]

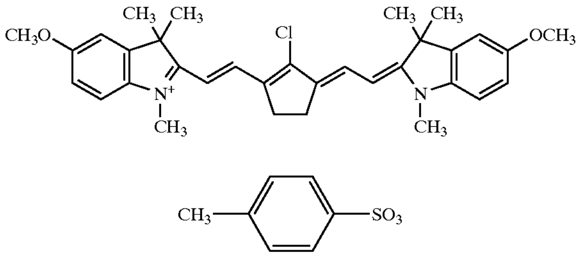

[IR-6]

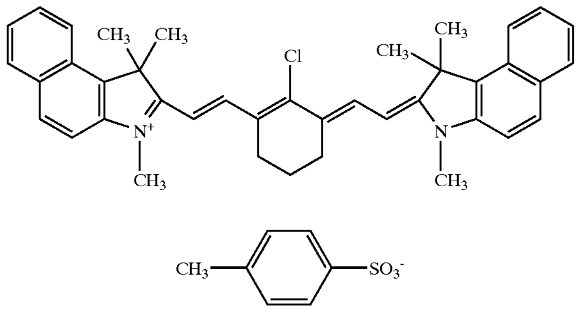

[IR-7]

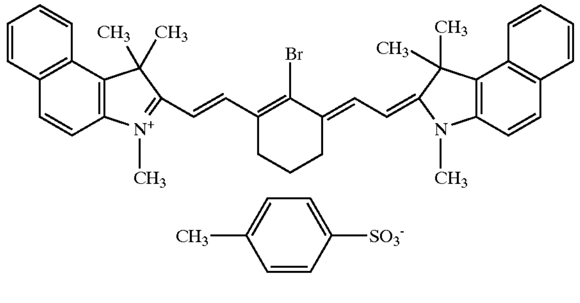

-continued

[IR-8]

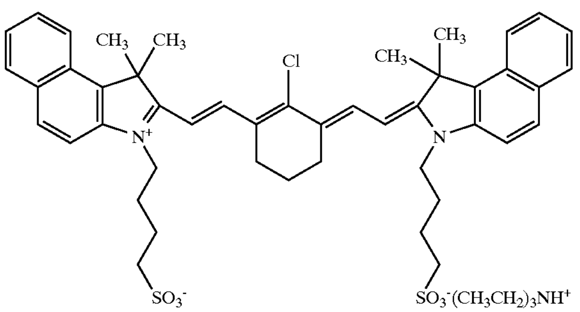

[IR-9]

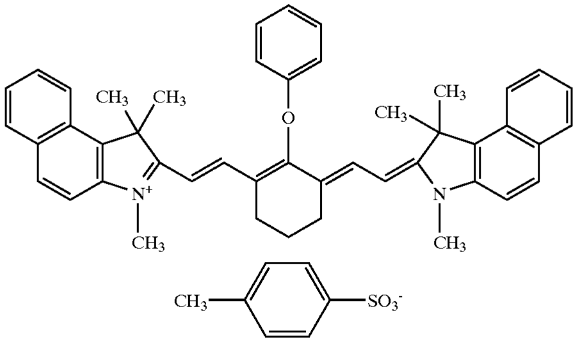

[IR-10]

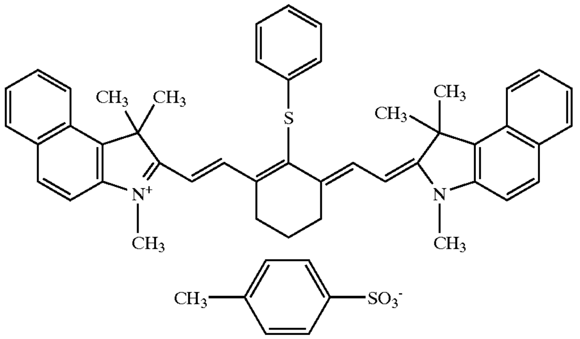

[IR-11]

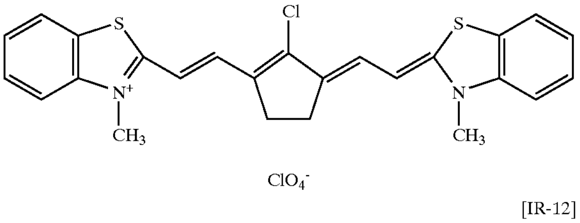

[IR-12]

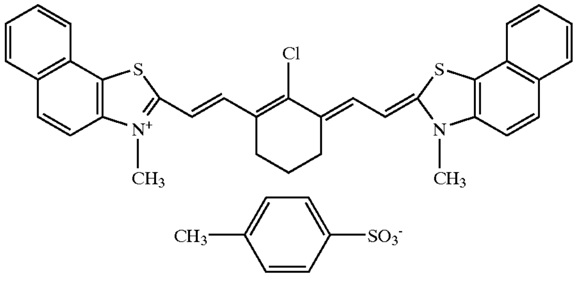

Examples of the pigment which can be used as the infrared absorbent in the present invention include commercially available pigments and pigments described in *Color Index* (*C.I.*) *Binran* (*C.I. Handbook*), *Saishin Ganryo Binran* (*Handbook of Newest Pigments*), compiled by Nippon Ganryo Gijutsu Kyokai (1977), *Saishin Ganryo Oyo Gijutsu* (*Up-To-Date Pigment Application Technology*), CMC (1986), and *Insatsu Ink Gijutsu* (*Printing Ink Technology*), CMC (1984).

The kind of pigment includes black pigment, yellow pigment, orange pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-base pigments, anthraquinone-base pigments, perylene- and perynone-base pigments, thioindigo-base pigments, quinacridone-base pigments, dioxazine-base pigments, isoindolinone-base pigments, quinophthalone-base pigments, dyed lake pigments, azine pigments, nitroso pigments, nitro pigments, natural pigments, fluorescent pigments, inorganic pigments and carbon black. Among these pigments, carbon black is preferred.

These pigments may or may not be surface-treated before use. For the surface treatment, a method of coating the surface with resin or wax, a method of attaching a surfactant, or a method of bonding a reactive substance (for example, silane coupling agent, epoxy compound or isocyanate compound) to the pigment surface may be used. These surface-treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Up-To-Date Pigment Application Technology*), CMC (1986).

The particle size of the pigment is preferably from 0.01 to 10 μm, more preferably from 0.05 to 1 μm, still more preferably from 0.1 to 1 μm. Use of a pigment having a particle size of less than 0.01 μm is not preferred in view of stability of the dispersion in the coating solution for the photosensitive layer, and use of a pigment having a particle size exceeding 10 μm is not preferred in view of uniformity of the photosensitive layer.

For dispersing the pigment, a known dispersion technique for use in the production of ink or toner may be used. Examples of the disperser include-ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Up-To-Date Pigment Application Technology*), CMC (1986).

The infrared absorbent may be added to the photosensitive layer in a ratio of 0.01 to 50 wt %, preferably from 0.1 to 20 wt %, more preferably from 1 to 10 wt %, to the entire solid content of the coating solution for the photosensitive layer. If the amount added is less than 0.01 wt %, the sensitivity decreases, whereas if it exceeds 50 wt %, staining is generated in the image area at printing. When a recording material is produced by using an infrared absorbent, the optical density at the absorption maximum in the infrared region is preferably from 0.1 to 3.0. If the optical density is out of this range, the sensitivity decreases. The optical density is determined according to the amount of the infrared absorbent added and the thickness of the recording layer, therefore, a desired optical density can be obtained by controlling these two conditions. The optical density of the recording layer can be measured by an ordinary method. Examples of the measuring method include a method of forming on a transparent or white support a recording layer having an appropriately decided thickness in the range of giving a dry coated amount necessary as a lithographic printing plate and measuring the optical density by a transmission-type optical densitometer, and a method of forming a recording layer on a reflective support such as aluminum and measuring the reflection density. The infrared absorbents may be used individually or in combination of two or more thereof. The infrared absorbent may be added to the same layer as other components or may be added to a layer separately provided.

(2) Radical Generator

The radical generator for use in the present invention indicates a compound of generating a radical when used in combination with the ultraviolet absorbent (A) and irradiated with an infrared laser. Examples of the radical generator include onium salt, triazine compound having a trihalomethyl group, peroxide, azo-type polymerization initiator, azide compound and quinonediazide. Among these, onium salt is preferred because of its high sensitivity.

The onium salt which can be suitably used as a radical polymerization initiator in the present invention is described below. Preferred examples of the onium salt include iodonium salt, diazonium salt and sulfonium salt. These onium salts function as an initiator of radical polymerization but not as an acid generator. The onium salt for use in the present invention is suitably an onium salt represented by the following formula (III), (IV) or (V):

$$Ar^{11}—I^{+}—Ar^{12} \quad Z^{11-} \qquad \text{(III)}$$

$$Ar^{21}—\overset{+}{N}\equiv N \quad Z^{21-} \qquad \text{(IV)}$$

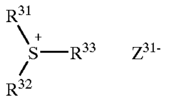

(V)

In formula (III), $Ar^{11}$ and $Ar^{12}$ each independently represents an aryl group having 20 or less carbon atoms, which may have a substituent. In the case where the aryl group has a substituent, preferred examples of the substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of halide ion, perchlorate ion, tetrafluoroborate ion, hexafluorophosphate ion and sulfonate ion, preferably perchlorate ion, hexafluorophosphate ion or arylsulfonate ion.

In formula (IV), $Ar^{21}$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In formula (V), $R^{31}$, $R^{32}$ and $R^{33}$ may be the same or different and each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms, and an aryl group having 12 or less carbon atoms. $Z^{31-}$ represents a counter ion having the same meaning as $Z^{11-}$.

Specific examples of the onium salt which can be suitably used as the radical generator include those described in paragraphs [0030] to [0033] of JP-A-2001-133969.

[OS-1]

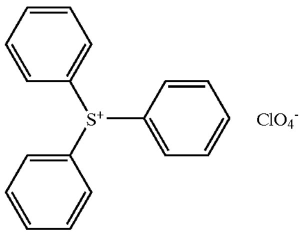

[OS-2]

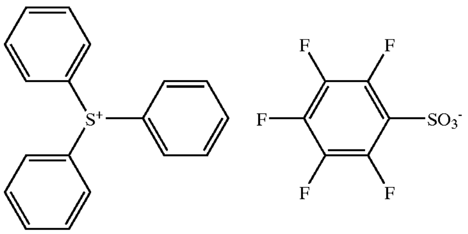

[OS-3]

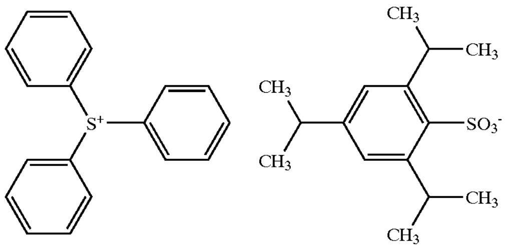

[OS-4]

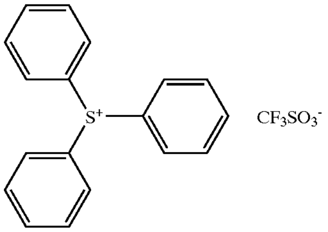

-continued
[OS-5]
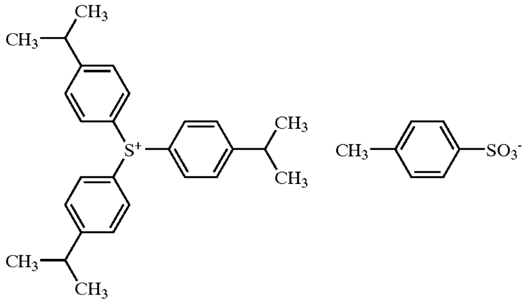
[OI-1]
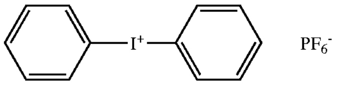
[OI-2]
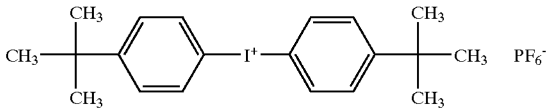
[OI-3]
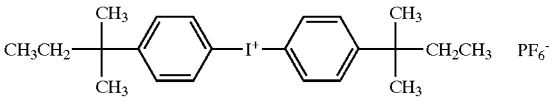
[OI-4]
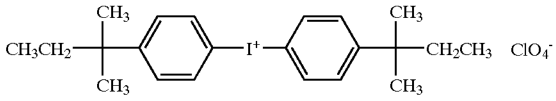
[OI-5]
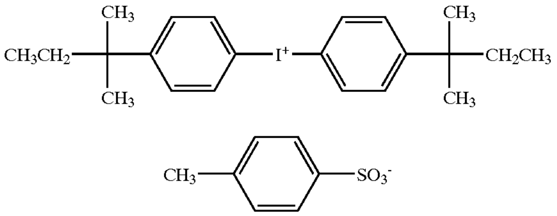
[OI-6]
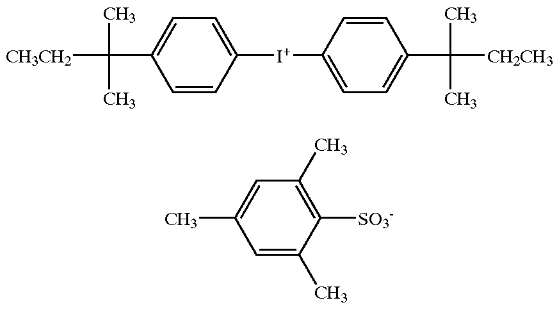
[OI-7]
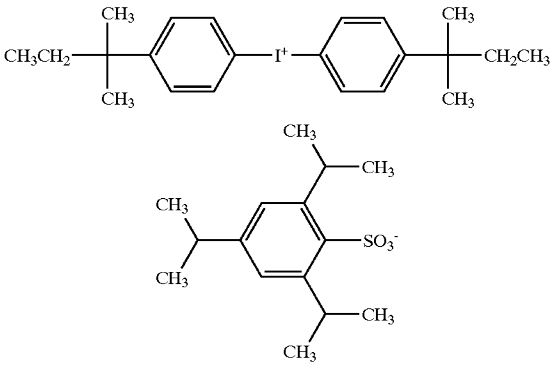
[OI-8]
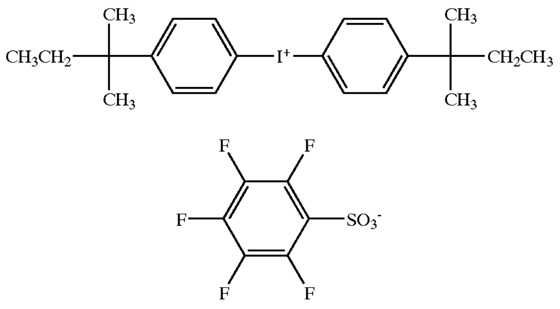
[OI-9]
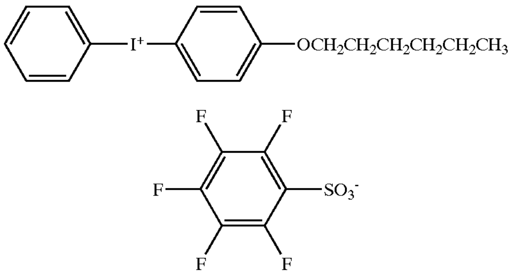
[OI-10]
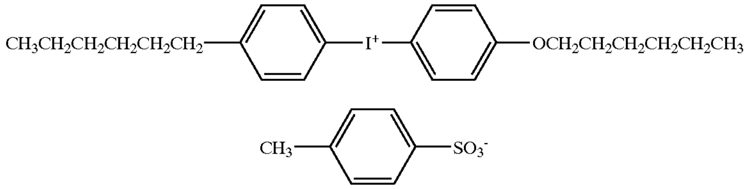

-continued

[ON-1]

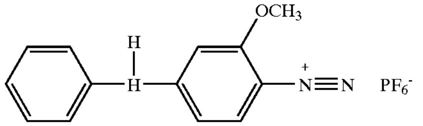

[ON-2]

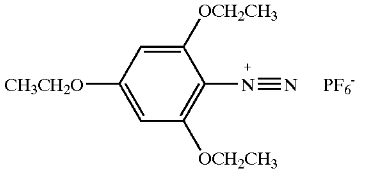

[ON-3]

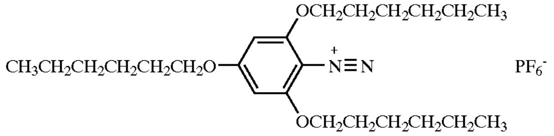

[ON-4]

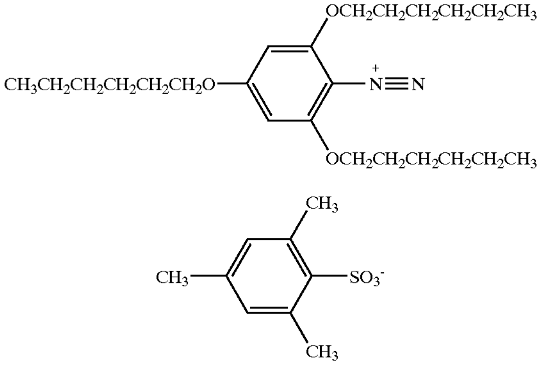

[ON-5]

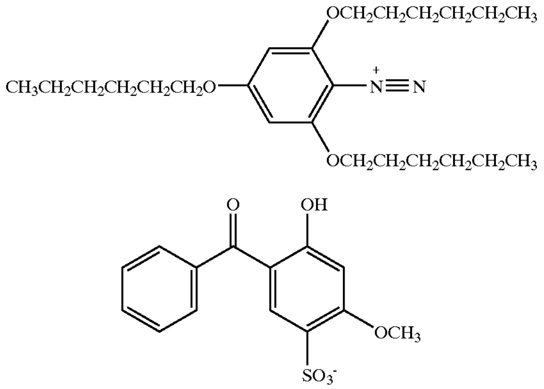

The radical generator for use in the present invention preferably has an absorption maximum wavelength of 400 nm or less, more preferably 360 nm or less. By having the absorption wavelength in the ultraviolet region as such, the image-forming material can be dealt with under white light.

The radical generator can be added to the coating solution for the photosensitive layer in a ratio of 0.1 to 50 wt %, preferably from 0.5 to 30 wt %, more preferably from 1 to 20 wt %, to the entire solid content of the coating solution for the photosensitive layer. If the amount added is less than 0.1 wt %, the sensitivity decreases, whereas if it exceeds 50 wt %, staining is generated on the non-image area at printing. These radical generators may be used individually or in combination of two or more thereof. The radical generator may be added to the same layer as other components or may be added to a layer separately provided.

(3) Radical Polymerizable Compound

The radical polymerizable compound for use in the present invention is a radical polymerizable compound having at least one ethylenic unsaturated double bond and is selected from compounds having at least one, preferably two or more, ethylenic unsaturated terminal bond(s). Such compounds are widely known in this industrial field and those known compounds all can be used in the present invention without limit. This compound has a chemical form of, for example, monomer, prepolymer, more specifically, dimer, trimer or oligomer, or a mixture or copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, addition reaction products of an unsaturated carboxylic acid ester or amide having a nucleophilic substituent such as hydroxyl group, amino group or mercapto group with a monofunctional or polyfunctional isocyanate or an epoxy, and dehydration condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, an amine or a thiol, and substitution reaction products of an unsaturated carboxylic acid ester or amide having a splitting-off substituent such as halogen group or tosyloxy group with a monofunctional or polyfunctional alcohol, an amine or a thiol may also be suitably used. These compounds but where the unsaturated carboxylic acid is replaced by an unsaturated phosphonic acid, styrene or the like, may also be used.

Specific examples of the radical polymerizable compound which is an ester of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate and polyester acrylate oligomer;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane and bis[p-(methacryloxyethoxy) phenyl]dimethylmethane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

crotonic acid esters such as ethylene glycol dicrotonate, tetramethylene glycol dicrotonate, pentaerythritol dicrotonate and sorbitol tetradicrotonate;

isocrotonic acid esters such as ethylene glycol diisocrotonate, pentaerythritol diisocrotonate and sorbitol tetraisocrotonate; and maleic acid esters such as ethylene glycol dimaleate, triethylene glycol dimaleate, pentaerythritol dimaleate and sorbitol tetramaleate.

Other examples of the ester include aliphatic alcohol-base esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyvalent amine compound with an unsaturated carboxylic acid include methylenebis-acrylamide, methylene-bis-methacrylamide, 1,6-hexamethylenebis-acrylamide, 1,6-hexamethylenebis-methacrylamide, diethylenetriaminetris-acrylamide, xylylenebisacrylamide and xylylenebis-methacrylamide.

Other preferred examples of the amide-type monomer include those having a cyclohexylene structure described in JP-B-54-21726.

A urethane-base addition polymerizable compound produced by using an addition reaction of isocyanate and a hydroxyl group is also suitably used and specific examples thereof include vinyl urethane compounds having two or more polymerizable vinyl groups within one molecule described in JP-B-48-41708, which are obtained by adding a vinyl monomer having a hydroxyl group represented by the following formula (VI) to a polyisocyanate compound having two or more isocyanate groups within one molecule:

$$CH_2{=}C(R_{41})COOCH_2CH(R_{42})OH \quad (VI)$$

(wherein $R_{41}$ and $R_{42}$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used.

Furthermore, radical polymerizable compounds having an amino or sulfide structure within the molecule described in JP-A-63-277653, JP-A-63-260909 and JP-A-1-105238 may be used.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-base compounds described in JP-A-2-25493 may be used. In some cases, structures containing a perfluoroalkyl group described in JP-A-61-22048 are suitably used. Furthermore, those described as a photocurable monomer or oligomer in *Nippon Secchaku Kyokaishi* (*Journal of Japan Adhesive Society*), Vol. 20, No. 7, pp. 300–308 (1984) may also be used.

Details of the use method of the radical polymerizable compound, such as selection of the structure, sole or combination use and amount added, can be freely determined in accordance with the designed performance of final recording material. For example, the compound is selected from the following standpoints. In view of sensitivity, a structure having a large unsaturated group content per one molecule is preferred and in most cases, a bifunctional or greater functional group is preferred. For increasing the strength of image area, namely, hardened layer, a trifunctional or greater functional group is preferred. A combination use of compounds different in the functional number and in the polymerizable group (for example, an acrylic acid ester, a methacrylic acid ester or a styrene-base compound) is an effective method for controlling both the photosensitivity and the strength. A compound having a large molecular weight or a compound having high hydrophobicity is excellent in the sensitivity and layer strength but is not preferred in some cases in view of developing speed and precipitation in the developer. The selection and use method of the radical polymerizable compound are important factors for the compatibility and dispersibility with other components (e.g., binder polymer, initiator, coloring agent) in the photosensitive composition. For example, the compatibility may be improved in some cases by using a low purity compound or using two or more compounds in combination. Also, a specific structure may be selected for the purpose of improving the adhesive property to the support or overcoat layer. As for the ratio of the radical polymerizable compound blended in the image-recording layer, a larger ratio is advantageous in view of sensitivity but if the ratio blended is too large, undesired phase separation may occur, a problem may arise in the production step due to adhesive property of the image-recording layer (e.g., production failure due to transfer or adhesion of recording layer components), or precipitation may be disadvantageously generated from the developer. In view of these, the ratio blended is in most cases from 5 to 80 wt %, preferably from 20 to 75 wt %, to all components of the composition. The radical polymerizable compounds may be used individually or in combination of two or more thereof. As for the use method of the radical polymerizable compound, appropriate structure, blending and amount added can be freely selected by taking account of the degree of polymerization inhibition due to oxygen, resolution, fogging, change in refractive index, surface adhesive property and the like. Depending on the case, a layer construction and a coating method, such as undercoat and overcoat, can also be employed.

(4) Binder Polymer

The photosensitive layer preferably further contains a binder polymer. The binder is preferably a linear organic polymer. This "linear organic polymer" may be any linear organic polymer. Preferably, a linear organic polymer soluble or swellable in water or alkalescent water is selected so as to enable water development or alkalescent water development. The linear organic polymer is selected not only as a film-forming agent of the photosensitive layer but also according to the use as a water, alkalescent water or organic solvent developing agent. For example, when a water-soluble organic polymer is used, water development can be performed. Examples of the linear organic polymer include radical polymers having a carboxylic acid group in the side chain, such as methacrylic acid copolymers, acrylic acid copolymers, itaconic acid copolymers, crotonic acid copolymers, maleic acid copolymers and partially esterified maleic acid copolymers described in JP-A-59-44615, JP-B-54-34327, JP-B-58-12577, JP-B-54-25957, JP-A-54-92723, JP-A-59-53836 and JP-A-59-71048. Furthermore, acidic cellulose derivatives having a carboxylic acid group in the side chain may also be used. Other than these, polymers obtained by adding a cyclic acid anhydride to a polymer having a hydroxyl group are useful.

Among these, (meth)acrylic resins having a benzyl group or allyl group and a carboxyl group in the side chain are preferred because of excellent balance in the layer strength, sensitivity and developability.

Also, the acid group-containing urethane-base binder polymers described in JP-B-7-12004, JP-B-7-120041, JP-B-7-120042, JP-B-8-12424, JP-A-63-287944, JP-A-63-287947, JP-A-1-271741 and Japanese Patent Application No. 10-116232 are advantageous in view of press life and suitability for low exposure because of their very excellent strength.

Other than these, polyvinylpyrrolidone, polyethylene oxide and the like are useful as a water-soluble linear organic polymer. Also, an alcohol-soluble nylon and a polyether of 2,2-bis-(4-hydroxyphenyl)-propane with epichlorohydrin are useful for the purpose of increasing the strength of hardened film.

The weight average molecular weight of the polymer for use in the present invention is preferably 5,000 or more, more preferably from 10,000 to 300,000. The number average molecular weight is preferably 1,000 or more, more preferably from 2,000 to 250,000. The polydisperse degree (weight average molecular weight/number average molecular weight) is preferably 1 or more, more preferably from 1.1 to 10.

The polymer may be a random polymer, a block polymer, a graft polymer or the like but is preferably a random polymer.

The polymer for use in the present invention can be synthesized by a conventionally known method. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents are used individually or in combination of two or more thereof.

The radical polymerization initiator used in the synthesis of the polymer for use in the present invention may be a known compound such as azo-type initiator or peroxide initiator.

The binder polymers for use in the present invention may be used individually or in combination. The binder polymer is added to the photosensitive layer in a ratio of 20 to 95 wt %, preferably from 30 to 90 wt %, to the entire solid content of the photosensitive layer. If the amount added is less than 20 wt %, when an image is formed, the image area becomes deficient in the strength. On the other hand, if the amount added exceeds 95 wt %, an image cannot be formed. The weight ratio of the compound having a radical polymerizable ethylenic unsaturated double bond to the linear organic polymer is preferably from 1/9 to 7/3.

(5) Other Components

In the present invention, other than those described above, various compounds may be further added, if desired. For example, a dye having a large absorption in the visible light region may be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-base pigment, azo-base pigment, carbon black and titanium oxide may be suitably used.

The colorant is preferably added so as to provide clear distinction between the image area and the non-image area after the image formation. The amount of the colorant added is from 0.01 to 10 wt % based on the entire solid content of the photosensitive layer.

In the present invention, a higher fatty acid derivative such as behenic acid or behenic acid amide may be added, if desired, to localize on the surface of the photosensitive layer in the process of drying after the coating so as to prevent polymerization inhibition by oxygen. The amount of the higher fatty acid derivative added is preferably from about 0.1 wt % to about 10 wt % based on the entire composition.

In the present invention, the photosensitive layer may contain a nonionic surfactant described in JP-A-62-251740 and JP-A-3-208514 or an amphoteric surfactant described in JP-A-59-121044 and JP-A-4-13149 so as to broaden the processing stability against development conditions.

Specific examples of the nonionic surfactant include sorbitan tristearate, sorbitan monopalmitate, sorbitan trioleate, stearic acid monoglyceride and polyoxyethylenenonylphenyl ether.

Specific examples of the amphoteric surfactant include alkyldi(aminoethyl)glycine, alkylpolyaminoethyl glycine hydrochloride, 2-alkyl-N-carboxyethyl-N-hydroxyethylimidazolinium betaine and N-tetradecyl-N,N-betaine type (for example, AMORGEN K, trade name, produced by Daiichi Kogyo K. K.).

The ratio of the nonionic surfactant or amphoteric surfactant occupying in the photosensitive layer is preferably from 0.05 to 15 wt %, more preferably from 0.1 to 5 wt %.

In the present invention, the photosensitive layer may contain a plasticizer for imparting flexibility to the coating, if desired. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

The above-described components are dissolved in a solvent to prepare a coating solution for the photosensitive layer. Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water, however, the present invention is not limited thereto. These solvents are used individually or in combination. The concentration of the above-described components (the entire solid content containing additives) in the solvent is preferably from 1 to 50 wt %.

The amount (solid content) coated of the photosensitive layer obtained on the support after the coating and drying varies depending on the use, however, in the case of a lithographic printing plate in general, it is preferably from 0.5 to 5.0 $g/m^2$. The coating solution may be coated by various methods such as bar coater coating, rotary coating, spray coating, curtain coating, dip coating, air knife coating, blade coating and roll coating. As the amount coated is smaller, the apparent sensitivity becomes higher, however, the film properties of the image-recording layer decreases.

In the present invention, the coating solution for the photosensitive layer may contain a surfactant so as to improve the coatability, such as a fluorine-containing surfactant described, for example, in JP-A-62-170950. The amount of the surfactant added is preferably from 0.01 to 1 wt %, more preferably from 0.05 to 0.5 wt %, based on the entire solid content of the coating solution for the photosensitive layer.

[III] Support

The support for use in the present invention is an aluminum plate. The aluminum plate is lightweight and excellent in the surface-treating property, workability and corrosion resistance. Examples of the aluminum material include JIS 1050 material, JIS 1100 material, JIS 1070 material, Al—Mg alloy, Al—Mn alloy, Al—Mn—Mg alloy, Al—Zr alloy and Al—Mg—Si alloy.

Known techniques related to the aluminum material which can be used for the support, are enumerated below.

(1) With respect to JIS 1050 material, the following techniques are disclosed: JP-A-59-153861, JP-A-61-51395, JP-A-62-146694, JP-A-60-215725, JP-A-60-215726, JP-A-60-215727, JP-A-60-215728, JP-A-61-272357, JP-A-58-11759, JP-A-58-42493, JP-A-58-221254, JP-A-62-148295, JP-A-4-254545, JP-A-4-165041, JP-B-3-68939, JP-A-3-234594, JP-B-1-47545, JP-A-62-140894, JP-B-1-35910 and JP-B-55-28874.

(2) With respect to JIS 1070 material, the following techniques are disclosed: JP-A-7-81264, JP-A-7-305133, JP-A-8-49034, JP-A-8-73974, JP-A-8-108659 and JP-A-8-92679.

(3) With respect to the Al—Mg alloy, the following techniques are disclosed: JP-B-62-5080, JP-B-63-60823, JP-B-3-61753, JP-A-60-203496, JP-A-60-203497, JP-B-3-11635, JP-A-61-274993, JP-A-62-23794, JP-A-63-47347, JP-A-63-47348, JP-A-63-47349, JP-A-64-61293, JP-A-63-135294, JP-A-63-87288, JP-B-4-73392, JP-B-7-100844, JP-A-62-149856, JP-B-4-73394, JP-A-62-181191, JP-B-5-76530, JP-A-63-30294, JP-B-6-37116, JP-A-2-215599 and JP-A-61-201747.

(4) With respect to the Al—Mn alloy, the following techniques are disclosed: JP-A-60-230951, JP-A-1-306288, JP-A-2-293189, JP-B-54-42284, JP-B-4-19290, JP-B-4-19291, JP-B-4-19292, JP-A-61-35995, JP-A-64-51992, U.S. Pat. Nos. 5,009,722 and 5,028,276 and JP-A-4-226394.

(5) With respect to the Al—Mn—Mg alloy, the following techniques are disclosed: JP-A-62-86143, JP-A-3-222796, JP-B-63-60824, JP-A-60-63346, JP-A-60-63347, EP223737, JP-A-1-283350, U.S. Pat. No. 4,818,300 and British Patent 1,222,777.

(6) With respect to the Al—Zr alloy, the following techniques are known: JP-B-63-15978, JP-A-61-51395, JP-A-63-143234 and JP-A-63-143235.

(7) With respect to the Al—Mg—Si alloy, British Patent 1,421,710 is known.

With respect to the production method of the aluminum plate for support, the following methods may be used. A molten metal of an aluminum alloy containing the above-described components and having the above-described alloy component ratio is subjected to a cleaning treatment by an ordinary method and then cast. In the cleaning treatment, a flux treatment, a degassing treatment using Ar gas or Cl gas, a filtering treatment using a so-called rigid media filter such as ceramic tube filter or ceramic foam filter, a filter with the filter medium being alumina flake or alumina ball, or a glass cloth filter, or a treatment using a combination of degassing and filtering, is performed. This cleaning treatment is preferably performed so as to prevent occurrence of defects due to foreign matters in the molten metal, such as nonmetallic inclusion or oxide, or defects due to gas dissolved in the molten metal.

The techniques on filtering of the molten metal are known in JP-A-6-57342, JP-A-3-162530, JP-A-5-140659, JP-A-4-231425, JP-A-4-276031, JP-A-5-311262 and JP-A-6-136466.

The techniques on degassing of the molten metal are known in JP-A-5-51659, JP-A-5-51660, JP-U-A-5-49148 (the term "JP-U-A" as used herein means an "unexamined published Japanese utility model application") and JP-A-7-40017.

The molten metal thus subjected to a cleaning treatment is then cast. The casting method includes a method using a fixed mold, represented by DC casting, and a method using a driving mold, represented by continuous casting. In the case of using the DC casting method, the molten metal is solidified at a cooling rate of 1 to 300° C./sec. If the cooling rate is less than 1° C./sec., a large number of coarse intermetallic compounds are formed.

Examples of the continuous casting method which is used in industry include a Hunter method, a method using a cold roll, represented by 3C method, a Hazellett method, and a method using cooling belt or cooling block, represented by Alusuisse Caster II. In the case of using the continuous casting method, the molten metal is solidified at a cooling rate of 100 to 1,000° C./sec. In general, the cooling rate is high as compared with the DC casting method and therefore, the solid solubility of the alloy components to the aluminum matrix can be elevated. The continuous casting method is disclosed by the present inventors in JP-A-3-79798, JP-A-5-201166, JP-A-5-156414, JP-A-6-262203, JP-A-6-122949, JP-A-6-210406 and JP-A-6-262308.

In the case of performing DC casting, an ingot having a plate thickness of 300 to 800 nm is produced. This ingot is scalped by an ordinary method to cut from 1 to 30 mm, preferably from 1 to 10 mm, of the surface layer. Thereafter, the plate is soaked, if desired. In the soaking treatment, a heat treatment is performed at 450 to 620° C. for 1 to 48 hours so as not to cause coarsening of the intermetallic compound. If the treating time is less than 1 hour, the effect attained by the soaking treatment is insufficient. Subsequently, the aluminum plate is hot-rolled and then cold-rolled to obtain an aluminum rolled plate. The temperature at the initiation of hot rolling is in the range from 350 to 500° C. Before, after or during the cold rolling, an intermediate annealing treatment may be applied. The intermediate annealing is performed under heating conditions of, in the case of using a batch-system annealing furnace, 280 to 600° C. for 2 to 20 hours, preferably 350 to 500° C. for 2 to 10 hours, or in the case of using a continues annealing furnace, 400 to 600° C. for 360 seconds or less, preferably 450 to 550° C. for 120 seconds or less. By using a continuous annealing furnace and elevating the heating temperature at a rate of 10° C./sec or more, the crystal structure may be made fine.

The Al plate finished to a predetermined thickness of 0.1 to 0.5 mm through the above-described steps may be improved in the planeness by a sizing apparatus such as roller leveler or tension leveler. The improvement of planeness may be performed after cutting the plate into a sheet form but in order to elevating the productivity, the improvement of planeness is preferably performed while the plate is in a continuous coil state. For the working to a predetermined plate width, the Al plate is usually passed through a slitter line. On the edge face cut by the slitter, one or both of sheared surface and ruptured surface are generated at the cutting by the slitter blade.

The plate thickness accuracy is suitably within ±10 $\mu$m, preferably within ±6 $\mu$m, over the entire coil length. The plate thickness difference in the cross direction is suitably within 6 $\mu$m, preferably within 3 $\mu$m. The plate width accuracy is suitably within ±1.0 mm, preferably within ±0.5 mm. The surface roughness of the Al plate is readily affected by the surface roughness of the roller, but the Al plate is preferably finished to finally have a center line surface roughness (Ra) of approximately from 0.1 to 1.0 $\mu$m. If the Ra is excessively large, the original roughness of Al, namely, coarse rolled streaks transferred from the roller, is viewed through the photosensitive layer after a lithographic printing plate is completed by the surface-roughening treatment and the coating of photosensitive layer, and this is not preferred in view of appearance. On the other hand, if Ra is less than 0.1 $\mu$m, the surface of the roller must be finished to have excessively low roughness and this is industrially disadvantageous.

In order to prevent generation of scratches due to friction between Al plates, a thin oil film may be provided on the surface of the Al plate. For the oil film, a volatile material or an nonvolatile material is appropriately used according to the purpose. If the oil amount is excessively large, slipping failure may occur in the production line, whereas if the oil amount is nil, troubles such as generation of scratches take place during the transportation of coils. Accordingly, the oil amount is suitably from 3 to 100 mg/m$^2$. The upper limit thereof is preferably 50 mg/m$^2$ or less, more preferably 10 mg/m$^2$ or less. With respect to the cold rolling, details are disclosed in JP-A-6-210308.

In the case of performing continuous casting, for example, when a cooling roller by the Hunter method is used, a cast plate having a thickness of 1 to 10 mm can be directly and continuously cast and rolled and the hot-rolling step can be advantageously dispensed with. When a cooling roller by the Hazellett method is used, a cast plate having a thickness of 10 to 50 mm can be cast and in general, by disposing a hot-rolling roller immediately after the casting and continuously rolling the plate, a continuously cast and rolled plate having a thickness of 1 to 10 mm can be obtained. These continuously cast and rolled plates are, in the same manner as described in the case of DC casting, subjected to cold rolling, intermediate annealing, improvement of planeness, slitting and the like and finished to a plate thickness of 0.1 to 0.5 mm. The intermediate annealing conditions and cold rolling conditions in the case of using a continuous casting method are described in JP-A-6-220593, JP-A-6-210308, JP-A-7-54111 and JP-A-8-92709.

The surface-roughening treatment of roughening the support surface so as to attain good adhesion between the support and the photosensitive layer and at the same time impart water receptivity to the non-image area is called a graining treatment. Specific means for this graining treatment includes a mechanical graining method such as sand blast, ball graining, wire graining, brush graining by nylon brush and abrasive/water slurry, and horning of colliding abrasive/water slurry to the surface under high pressure, and a chemical graining method of roughening the surface with an etchant comprising an alkali, an acid or a mixture thereof. In addition, an electrochemical graining method described in British Patent 896,563, JP-A-53-67507, JP-A-54-146234 and JP-B-48-28123, a method using a combination of mechanical graining and electrochemical graining described in JP-A-53-123204 and JP-A-54-63902, and a method using a combination of mechanical graining and chemical graining with a saturated aqueous solution containing an aluminum salt of mineral acid described in JP-A-56-55261, are known. Furthermore, the surface may be roughened by a method of adhering granular materials to the support material using an adhesive or means having the adhesive effect or by press-contacting a continuous belt or roller having fine asperities to the support material and transferring the asperities.

The surface-roughening treatments are each described in detail below, however, the present invention is not limited thereto.

(a) Mechanical Surface-Roughening Treatment

The mechanical surface-roughening is performed by a rotating roller-shaped nylon brush while supplying a suspension of an abrasive (pumice stone or quartz sand) and water, having a specific gravity of 1.12, as the polishing slurry solution to the aluminum plate. The average particle size of the abrasive is from 40 to 45 $\mu$m and the maximum particle size is 200 $\mu$m. The construction material of the nylon brush is 6·10 nylon and the bristle has a length of 50 mm and a diameter of 0.3 mm. The nylon brush is obtained by densely implanting the bristles in holes punched on a stainless steel-made cylinder having a diameter of 300 mm. Three rotary brushes are used. The distance between two supporting rollers (each having a diameter of 200 mm) at the lower part of the brush is 300 mm. The brush roller is pressed until the load of the driving motor for rotating the brush reaches 7 KW larger than the load before pressing the brush roller to the aluminum plate. The rotation direction of the brush is the same as the direction of the aluminum plate moving and the rotation number is 200 rpm.

(b) Etching Treatment by Alkali Agent

An etching treatment is performed by spraying an etching solution having a caustic soda concentration of 2.6 wt % and an aluminum ion concentration of 6.5 wt % at a temperature of 70° C. to dissolve 13 g/m$^2$ the aluminum plate. Thereafter, the aluminum plate is washed with water by spraying.

(c) Desmutting Treatment

A desmutting treatment is performed by spraying an aqueous solution having a nitric acid concentration of 1 wt % (containing 0.5 wt % of aluminum ion) at a temperature of 30° C. Thereafter, the aluminum plate is washed with water by spraying. For the aqueous nitric acid solution used in the desmutting, a waste solution from the step of performing electrochemical surface-roughening using an alternating current in an aqueous nitric acid solution may be used.

(d) Electrochemical Surface-Roughening Treatment

An electrochemical surface-roughening treatment is continuously performed using an a.c. voltage of 60 Hz. In this electrochemical surface-roughening treatment, the electrolytic solution is an aqueous 1 wt % nitric acid solution (containing 0.5 wt % of aluminum ion and 0.007 wt % of ammonium ion), the temperature is 50° C., the a.c. power source waveform is a trapezoidal rectangular wave where the time until the current value reaches the peak from 0 is 2 msec and the duty ratio is 1:1, and the counter electrode is carbon electrode. For the auxiliary anode, ferrite is used.

The current density is 30 $A/dm^2$ as the current peak value and the quantity of electricity is 250 $C/dm^2$ as the total quantity of electricity when the aluminum plate is anode. To the auxiliary anode, 5% of the current flown from the power source is divided. After the treatment, the aluminum plate is washed with water by spraying.

(e) Etching Treatment

An etching treatment is performed at 70° C. by spraying an etching solution having a caustic soda concentration of 26 wt % and an aluminum ion concentration of 6.5 wt % to dissolve 13 $g/m^2$ of the aluminum plate, whereby the smut component mainly comprising aluminum hydroxide produced at the electrochemical surface-roughening using an alternating current in the previous stage is removed and the edge part of a pit produced is dissolved to give a smoothed edge part. Thereafter, the aluminum plate is washed with water by spraying.

(f) Desmutting Treatment

A desmutting treatment is performed by spraying an aqueous solution having a sulfuric acid concentration of 25 wt % (containing 0.5 wt % of aluminum ion) at a temperature of 60° C. Thereafter, the aluminum plate is washed with water by spraying.

A plurality of these surface-roughening treatments may be performed in combination, and the order and the number of repetitions may be freely selected. In the case of performing a plurality of surface-roughening treatments in combination, a chemical treatment with an aqueous acid or alkali solution may be performed therebetween so that the subsequent surface-roughening treatment can be uniformly performed. Specific examples of the aqueous acid or alkali solution include an aqueous solution of acids such as hydrofluoric acid, fluorozirconic acid, phosphoric acid, sulfuric acid, hydrochloric acid and nitric acid, and an aqueous solution of alkalis such as sodium hydroxide, sodium silicate and sodium carbonate. These aqueous acid or alkali solutions may be used individually or in combination of two or more thereof. The chemical treatment is generally performed using an aqueous solution containing from 0.05 to 40 wt % of such an acid or alkali, at a liquid temperature of 40 to 100° C. for from 5 to 300 seconds.

In advance of the surface roughening, the aluminum plate may be subjected, if desired, to a degreasing treatment, for example, with a surfactant, an organic solvent or an alkaline aqueous solution so as to remove the rolling oil on the surface. In the case of using an alkaline aqueous solution, a treatment with an acidic solution may be performed to effect neutralization and desmutting.

On the surface of the support subjected to the surface-roughening treatment, namely, graining, smuts are generated, therefore, in general, the support is preferably subjected to an appropriate treatment such as water washing or alkali etching to remove the smuts. Examples of this treatment include alkali etching described in JP-B-48-28123 and desmutting with sulfuric acid described in JP-A-53-12739.

In the case of the aluminum support for use in the present invention, after the surface-roughening treatment is applied, an oxide coating is usually formed on the support by anodization so as to improve abrasion resistance, chemical resistance and water receptivity.

The electrolyte for use in the anodization treatment of the aluminum plate may be any electrolyte as long as it forms a porous oxide coating. In general, sulfuric acid, phosphoric acid, oxalic acid, chromic acid or a mixed acid thereof is used. The concentration of the electrolyte is appropriately determined depending on the kind of the electrolyte. The conditions for anodization treatment vary depending on the electrolyte used and cannot be indiscriminately specified, however, the conditions in general are suitably such that the concentration of electrolyte is from 1 to 80% solution, the liquid temperature is from 5 to 70° C., the current density is from 5 to 60 $A/dm^2$, the voltage is from 1 to 100 V, and the electrolysis time is from 10 seconds to 5 minutes. The amount of the anodic oxide coating is suitably 1.0 $g/m^2$ or more, preferably from 2.0 to 6.0 $g/m^2$. If the anodic oxide coating is less than 1.0 $g/m^2$, insufficient press life results or the non-image area of the lithographic printing plate is readily scratched and so-called "scratch staining" of allowing attachment of ink to the scratched portion is liable to occur at the printing.

The anodized and then water washed support may be subjected to the following treatments so as to prevent the anodic oxide coating from dissolving in the developer, to prevent the photosensitive layer components from remaining in the coating, to improve the strength of the anodic oxide coating, to improve the hydrophilicity of the anodic oxide coating or to improve the adhesion to the photosensitive layer.

One of these treatments is a silicate treatment of treating the support by contacting the anodic oxide coating with an aqueous alkali metal silicate solution. In this case, the anodic oxide coating is contacted with an aqueous solution having an alkali metal silicate concentration of 0.1 to 30 wt %, preferably from 0.5 to 15 wt %, and having a pH at 25° C. of 10 to 13.5, at a temperature of 5 to 80° C., preferably from 10 to 70° C., more preferably from 15 to 50° C., for 0.5 to 120 seconds. The contact may be made by any method such as dipping or spraying. If the pH is less than 10, the aqueous alkali metal silicate solution is gelled, whereas if the pH exceeds 13.5, the anodic oxide coating dissolves.

Other than these, various sealing treatments may be used and, for example, water vapor sealing, boiling water (hot water) sealing, metal salt sealing (e.g., chromate/bichromate sealing, nickel acetate sealing), oil and fat impregnation sealing, synthetic resin sealing, and low-temperature sealing (with red prussiate or alkaline earth salt), which are generally known as a sealing treatment of anodic oxide coating, may be used. In view of the performance (adhesion with photosensitive layer or hydrophilicity) as the support of a printing plate, high-speed processing, low cost and low pollution, water vapor sealing is relatively preferred. In place of or subsequently to the sealing treatment, a dipping or spraying treatment with a nitrous acid solution may be performed.

After the above-described silicate treatment or sealing treatment is applied, the support may be subjected to a treatment with an acidic aqueous solution and the application of a hydrophilic undercoat disclosed in JP-A-5-278362, or to a treatment for providing an organic layer disclosed in JP-A-4-282637 and JP-A-7-314937, so as to increase the adhesion to the photosensitive layer.

After the support surface is subjected to these treatments or undercoating, a backcoat is applied to the back surface of the support, if desired. The backcoat is preferably a coating layer comprising a metal oxide obtained by hydrolyzing and polycondensing an organic polymer compound described in JP-A-5-45885 and an organic or inorganic metal compound described in JP-A-6-35174. Among these coating layers, those comprising a metal oxide obtained from an alkoxy compound of silicon, such as $Si(OCH_3)_4$, $Si(OC_2H_5)_4$, $Si(OC_3H_7)_4$ and $Si(OC_4H_9)_4$, are preferred because these alkoxy compounds of silicon are inexpensive and easily available and the coating layer can have excellent resistance against developer.

With respect to the preferred properties of the support for a lithographic printing plate, the center line average roughness is from 0.10 to 1.2 $\mu$m. If this roughness is less than 0.10 $\mu$m, the adhesive property with the photosensitive layer decreases and the press life is seriously reduced, whereas if it exceeds 1.2 $\mu$m, the staining property at the printing is worsened. The color density of the support is, in terms of reflection density value, from 0.15 to 0.65. If the color is white than 0.15, the halation is excessively intensified at the image exposure and this causes troubles in the image formation, whereas if the color is black than 0.65, the image can be hardly viewed at the plate inspection operation after the development and conspicuously poor suitability for plate inspection results. Incidentally, these center line roughness and color reflection density are values after mechanical graining, electrical graining and desmutting.

In the lithographic printing plate precursor of the present invention, an overcoat layer may be provided on the support, if desired. As such, the lithographic printing plate precursor of the present invention can be manufactured.

[IV] Image Formation Method

This lithographic printing plate precursor can perform the recording with an infrared laser. The recording may also be thermally made using an ultraviolet lamp or a thermal head. In the present invention, the image exposure is preferably performed using a solid laser or semiconductor laser capable of radiating an infrared ray at the wavelength of 760 to 1,200 nm. The laser output is preferably 100 mW or more and in order to shorten the exposure time, a multi-beam laser device is preferably used. The exposure time is preferably 20$\mu$ seconds or less per one picture element. The energy irradiated on the recording material is preferably from 10 to 300 mJ/cm$^2$.

After the exposure with an infrared laser, the image-recording material of the present invention is preferably developed with water or an alkaline aqueous solution.

In the case of using an alkaline aqueous solution as the developer, the developer and the replenisher used for the image recording material of the present invention may be a conventionally known aqueous alkali solution. Examples of the alkali agent include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisoproylamine, diisopropylamine, triisopropylamine, n-butylamine, monoethanolamine, diethanolamine, triethanolamine, monoisopropanolamine, diisopropanolamine, ethyleneimine, ethylenediamine and pyridine. These alkali agents may be used individually or in combination of two or more thereof.

In the case of developing the plate using an automatic developing machine, it is known that by adding an aqueous solution (replenisher) having an alkali intensity equal to or higher than that of developer, a large number of lithographic printing plates can be processed without exchanging the developer in the developing tank for a long period of time. Also in the present invention, this replenishing system is preferably used.

The developer and the replenisher may contain, if desired, various surfactants, organic solvents and the like so as to accelerate or inhibit the development, disperse the development scum or increase the ink-receptivity in the image area of the printing plate. Preferred examples of the surfactant include anionic, cationic, nonionic and amphoteric surfactants. Preferred examples of the organic solvent include benzyl alcohol. Also, polyethylene glycol or a derivative, polypropylene glycol or a derivative thereof, or the like is preferably added. In addition, a non-reducing sugar such as arabitol, sorbitol and mannitol may also be added.

Furthermore, the developer and the replenisher may contain, if desired, an inorganic salt-base reducing agent such as sodium salt and potassium salt of hydroquinone, resorcin, sulfurous acid or hydrogensulfurous acid, an organic carboxylic acid, a defoaming agent and a hard water-softening agent.

Examples of the developer containing a surfactant, an organic solvent, a reducing agent and the like include a developer composition comprising a benzyl alcohol, an anionic surfactant, an alkali agent and water described in JP-A-51-77401, a developer composition comprising a benzyl alcohol, an anionic surfactant and an aqueous solution containing a water-soluble sulfite described in JP-A-53-44202, and a developer composition containing an alkali agent, water and an organic solvent having water solubility of 10 wt % or less at ordinary temperature described in JP-A-55-155355. These developer compositions can be suitably used also in the present invention.

The printing plate developed using the above-described developer and replenisher is after-treated with washing water, a rinsing solution containing a surfactant or the like, or a desensitizing solution containing gum arabi or a starch derivative. In the case where the image recording material of the present invention is used as a printing plate, the after-treatment may be performed by variously combining these treatments.

In recent years, an automatic developing machine for printing plates is widely used for streamlining and standardizing the plate-making work in the art of plate-making and printing. This automatic developing machine generally consists of a development part and an after-treatment part and comprises a printing plate-conveying unit, and tanks and spray units for respective processing solutions, where while horizontally conveying an exposed printing plate, each processing solution pumped up is sprayed on the plate through a spray nozzle to develop the plate. Furthermore, a method of processing the printing plate while dipping and conveying it in processing solution tanks filled with respective processing solutions by means of guide rolls provided in the solution is also known. In this automatic processing, the processing can be performed while supplying the replenisher to each processing solution according to the amount processed, the operation time or the like. The replenisher may also be automatically supplied while sensing the electric conductivity by a sensor. Also, a so-called disposable processing system of processing the plate with a substantially unused processing solution may be applied.

The thus-obtained lithographic printing plate is, if desired, coated with a desensitizing gum and then subjected to the printing process. For obtaining a lithographic printing plate having a higher impression capacity, the plate is subjected to a burning treatment.

In the case of applying a burning treatment, the lithographic printing plate is preferably treated with a surface controlling solution described in JP-B-61-2518, JP-B-55-28062, JP-A-62-31859 and JP-A-61-159655 before the burning treatment.

For this treatment, a method of coating the surface controlling solution on the lithographic printing plate using a sponge or absorbent cotton impregnated with the solution, a method of dipping the printing plate in a vat filled with the surface controlling solution and thereby coating the solution, or a method of coating the solution using an automatic coater may be used. After the coating, the amount of the surface controlling solution coated is preferably rendered uniform using a squeegee or a squeegee roller to give more advantageous results. In general, the amount of the surface controlling solution coated is suitably from 0.03 to 0.8 $g/m^2$ (dry weight).

After the coating of the surface controlling agent, the lithographic printing plate is dried, if desired, and then heated to a high temperature by a burning processor (for example, a burning processor "BP-1300", available from Fuji Photo Film Co., Ltd.). At this time, the heating temperature and the heating time are preferably from 180 to 300° C. and from 1 to 20 minutes, respectively, though these may vary depending on the kind of components constituting the image.

After the burning treatment, the lithographic printing plate may be appropriately subjected to, if desired, conventional treatments such as water washing and gumming. However, in the case of using a surface controlling solution containing a water-soluble polymer compound or the like, a so-called desensitization treatment such as gumming may be omitted.

The lithographic printing plate obtained through these treatments is mounted on an off-set printing press or the like and used to print a large number of sheets.

EXAMPLES

The present invention is described in greater detail below by referring to the Examples, however, the present invention should not be construed as being limited thereto.

Examples 1 to 5

Manufacture of Support

A molten metal of JIS A1050 alloy containing 99.5% or more of aluminum, 0.30% of Fe, 0.10% of Si, 0.02% of Ti and 0.013% of Cu was subjected to a cleaning treatment and then cast. In the cleaning treatment, the molten metal was subjected to a degassing treatment for removing unnecessary gases such as hydrogen and then to a ceramic tube filter treatment. The casting was performed by the DC casting method. The solidified ingot having a plate thickness of 500 nm was scalped to 10 mm from the surface and subjected to a homogenization treatment at 550° C. for 10 hours so as to prevent the intermetallic compound from becoming coarse. Subsequently, the plate was hot-rolled at 400° C., subjected to intermediate annealing at 500° C. for 60 seconds in a continuous annealing furnace, and then cold-rolled to obtain an aluminum rolled plate having a plate thickness of 0.30 mm. By controlling the roughness of the rolling roller, the center line average surface roughness Ra after the cold rolling was controlled to 0.2 $\mu$m. Thereafter, the plate was applied with a tension leveler to improve the planeness.

Subsequently, the plate was surface-treated to obtain a support for a lithographic printing plate. The plate was first degreased with an aqueous 10% sodium aluminate solution at 50° C. for 30 seconds to remove the rolling oil on the aluminum plate surface and then treated for neutralization and desmutting with an aqueous 30% sulfuric acid solution at 50° C. for 30 seconds.

Then, the aluminum plate was subjected to a so-called graining treatment of roughening the support surface so as to attain good adhesion between the support and the photosensitive layer and at the same time to impart water receptivity to the non-image area. While keeping an aqueous solution containing 1% of nitric acid and 0.5% of aluminum nitrate at 45° C. and passing the aluminum web through the aqueous solution, the electrolytic graining was performed by applying a sine wave electric current at a current density of 20 $A/dm^2$ and a duty ratio of 1.1 from an indirect power supply cell to give a quantity of electricity of 240 $C/dm^2$ in the anode side. Thereafter, the plate was etched with an aqueous 10% sodium aluminate solution at 50° C. for 30 seconds and then treated for neutralization and desmutting with an aqueous 30% sulfuric acid solution at 50° C. for 30 seconds.

Furthermore, in order to improve the abrasion resistance, chemical resistance and water receptivity, an oxide coating was formed on the support by anodization. An aqueous 20% sulfuric acid solution at 35° C. was used as the electrolyte and while transporting the aluminum web through the electrolyte, the electrolytic treatment was performed by passing a d.c. current at 14 $A/dm^2$ from an indirect power supply cell to form an anodic oxide coating of 2.5 $g/m^2$. The thus-manufactured support had Ra (center line surface roughness) of 0.25 $\mu$m.

Interlayer

On this aluminum support, the following interlayer-forming solution (hereinafter called "undercoat solution") was coated by a wire bar and dried at 90° C. for 30 seconds using a hot air dryer. The coverage after drying was 20 $mg/m^2$.

| (Undercoat Solution A) | |
|---|---|
| Compound containing divalent or greater valent metal element (compound shown in Table 1) | 0.3 g |
| Methanol | 100 g |

Photosensitive Layer

Then, Solution [P] shown below was prepared and this solution was coated on the undercoated aluminum plate by a wire bar and dried at 115° C. for 45 seconds by a hot air dryer to obtain Negative-Type Lithographic Printing Plate Materials [P-1] to [P-5]. The coverage after drying was 1.3 $g/m^2$.

| <Photosensitive Layer-Forming Solution [P]> | |
|---|---|
| Infrared Absorbent [IR-1] | 0.10 g |
| Radical Generator [ON-4] | 0.30 g |
| Dipentaerythritol hexaacrylate | 1.00 g |
| A 80:20 (by mol) copolymer of allyl methacrylate and methacrylic acid (weight average molecular weight: 120,000) | 1.00 g |
| Naphthalenesulfonate of Victoria Pure Blue | 0.04 g |
| Fluorine-containing surfactant (Megafac F-176 produced by Dai-Nippon Ink & Chemicals, Inc.) | 0.01 g |
| Methyl ethyl ketone | 9.0 g |
| Methanol | 10.0 g |
| 1-Methoxy-2-propanol | 8.0 g |

TABLE 1

| | | |
|---|---|---|
| Example 1 | P-1 | $CaCl_2$ |
| Example 2 | P-2 | $Ca(OH)_2$ |
| Example 3 | P-3 | $(CH_3COO)_2Ca.H_2O$ |
| Example 4 | P-4 | $Ca(NO_3)_2.4H_2O$ |
| Example 5 | P-5 | $Mg(OH)_2$ |

Examples 6 to 10

Lithographic Printing Plate Precursors [P-6] to [P-10] were manufactured and evaluated in the same manner as in Examples 1 to 5 except for changing Photosensitive Layer-Forming Solution [P] to the following Photosensitive Layer-Forming Solution [Q]. The dry coverage of the photosensitive layer was 1.3 g/$m^2$.

| <Photosensitive Layer-Forming Solution [Q]> | |
|---|---|
| Infrared Absorbent [IR-6] | 0.10 g |
| Radical Generator [OS-4] | 0.30 g |
| A 30:20:30:20 (by mol) addition polymer of 4,4-diphenylmethane diisocyanate, hexamethylene diisocyanate, tetraethylene glycol and 2,2-bis (hydroxymethyl)-propionic acid (weight average molecular weight: 60,000) | 1.00 g |
| Naphthalenesulfonate of Victoria Pure Blue | 0.04 g |
| Stearic acid | 0.05 g |
| Fluorine-containing surfactant (Megafac F-176 produced by Dai-Nippon Ink & Chemicals, Inc.) | 0.01 g |
| Methyl ethyl ketone | 5.0 g |
| Methanol | 10.0 g |
| 1-Methoxy-2-propanol | 8.0 g |
| Methyl lactate | 2.0 g |
| γ-Butyrolactone | 2.0 g |

Comparative Examples 1 to 5

Lithographic Printing Plate Precursors [R-1] to [R-5] were manufactured and evaluated in the same manner as in Example 1 except that Undercoat Layer-Forming Solution A of Example 1 was replaced by the following Undercoat Layer-Forming Solution B. The dry coverage of the undercoat layer was 20 mg/$m^2$.

| (Undercoat Solution B) | |
|---|---|
| Compound containing monovalent metal element (compound shown in Table 2) | 0.3 g |
| Methanol | 100 g |

TABLE 2

| | | |
|---|---|---|
| Comparative Example 1 | P-6 | NaCl |
| Comparative Example 2 | P-7 | KCl |
| Comparative Example 3 | P-8 | $CH_3COONa$ |
| Comparative Example 4 | P-9 | $NaNO_3$ |
| Comparative Example 5 | P-10 | LiCl |

Exposure

The thus-obtained Negative-Type Lithographic Printing Plate Materials [P-1] to [P-10] and [R-1] to [R-5] each was exposed in Trendsetter 3244VFS manufactured by Creo, on which a water cooling 40W infrared semiconductor laser was mounted, under the conditions such that the output was 9 W, the outer drum rotation number was 210 rpm, the plate surface energy was 100 mJ/$cm^2$ and the resolution was 2,400 dpi.

Development Processing

After exposure, the plate materials each was developed using an automatic developing machine STABLON 900N manufactured by Fuji Photo Film Co., Ltd. The developer charged and the replenisher of the developer both were a 1:2 water-diluted solution of DN-3C produced by Fuji Photo Film Co., Ltd. and the unexposed area was removed to obtain a negative image. The obtained photosensitive materials each was used for printing in a press SOR-KZ manufactured by Heidelberg.

Evaluation of Press Life

The number of sheets which could be normally printed at the printing using the press SOR-KZ manufactured by Heidelberg was evaluated. As the number of sheets printed is larger, the press life is better. The results are shown in Table 3.

TABLE 3

| | Plate Material | Press Life | Background Staining |
|---|---|---|---|
| Example 1 | P-1 | 100,000 | Good |
| Example 2 | P-2 | 100,000 | Good |
| Example 3 | P-3 | 100,000 | Good |
| Example 4 | P-4 | 100,000 | Good |
| Example 5 | P-5 | 100,000 | Good |
| Example 6 | P-6 | 100,000 | Good |
| Example 7 | P-7 | 100,000 | Good |
| Example 8 | P-8 | 100,000 | Good |
| Example 9 | P-9 | 100,000 | Good |
| Example 10 | P-10 | 100,000 | Good |
| Comparative Example 1 | R-1 | 70,000 | Bad |
| Comparative Example 2 | R-2 | 70,000 | Bad |
| Comparative Example 3 | R-3 | 70,000 | Bad |
| Comparative Example 4 | R-4 | 70,000 | Bad |
| Comparative Example 5 | R-5 | 70,000 | Bad |

It is seen from the results in Table 3 that when a lithographic printing plate precursor having an interlayer containing the compound of Examples 1 to 10 is used, 100,000 sheets or more of good printed matters can be obtained and the press life is excellent. On the other hand, when a lithographic printing plate precursor having an interlayer containing the compound of Comparative Examples 1 to 5 is used, after about 70,000 sheets are printed, the image area of the plate is deteriorated and the background staining is generated, failing in obtaining a good printed matter any more.

Examples 11 to 14

Manufacture of Support

A molten metal of JIS A1050 alloy containing 99.5% or more of aluminum, 0.30% of Fe, 0.10% of Si, 0.02% of Ti and 0.013% of Cu was subjected to a cleaning treatment and then casting. In the cleaning treatment, the molten metal was subjected to a degassing treatment for removing unnecessary gases such as hydrogen and then to a ceramic tube filter treatment. The casting was performed by the DC casting method. The solidified ingot having a plate thickness of 500 mm was scalped to 10 mm from the surface and subjected to a homogenization treatment at 550° C. for 10 hours so as to prevent the intermetallic compound from becoming coarse. Subsequently, the plate was hot-rolled at 400° C., subjected to intermediate annealing at 500° C. for 60 seconds in a continuous annealing furnace, and then cold-rolled, to thereby obtain an aluminum rolled plate having a plate thickness of 0.30 mm. By controlling the roughness of the rolling roller, the center line average surface roughness Ra after the cold rolling was controlled to 0.2 $\mu$m. Thereafter, a tension leveler was applied to the plate to improve the planeness.

Subsequently, the plate was surface-treated to obtain a support for a lithographic printing plate. The plate was first degreased with a 10% aqueous solution of sodium aluminate at 50° C. for 30 seconds to remove the rolling oil on the aluminum plate surface and then treated for neutralization and desmutting with a 30% aqueous solution of sulfuric acid at 50° C. for 30 seconds.

Subsequently, the aluminum plate was subjected to a so-called graining treatment of roughening the surface of the support so as to attain good adhesion between the support and the photosensitive layer and at the same time to impart water receptivity to the non-image area. While maintaining an aqueous solution containing 1% of nitric acid and 0.5% of aluminum nitrate at 45° C. and passing the aluminum web through the aqueous solution, the electrolytic graining was performed by applying an alternating wave electric current at a current density of 20 A/dm$^2$ and a duty ratio of 1:1 from an indirect power supply cell to give a quantity of electricity of 240 c/dm$^2$ in the anode side. Thereafter, the plate was etched with a 10% aqueous solution of sodium aluminate at 50° C. for 30 seconds and then treated for neutralization and desmutting with a 30% aqueous solution of sulfuric acid at 50° C. for 30 seconds.

Further, for the purpose of improving abrasion resistance, chemical resistance and water receptivity, an oxide coating was formed on the support by anodization. A 20% aqueous solution of sulfuric acid was used at 35° C. as the electrolyte and while transporting the aluminum web through the electrolyte, the electrolytic treatment was performed by applying a d.c. current of 14 A/dm$^2$ from an indirect power supply cell, to thereby form an anodic oxide coating of 2.5 g/m$^2$.

Silicate Coating

In order to ensure a hydrophilic property as the non-image area of the printing plate, the aluminum web underwent a silicate treatment. The web was transported through a 1.5% aqueous solution of disodium trisilicate maintained at 70° C. so as to be contact with the solution for 15 seconds, then washed with water and dried at 100° C. for 60 seconds. The adhered amount of Si was 10 mg/m$^2$. The thus-manufactured support had Ra (center line surface roughness) of 0.25 $\mu$m.

Interlayer

On this aluminum support, the following interlayer-forming solution (hereinafter referred to as "undercoat solution") was coated by a wire bar, and the coated layer was dried at 90° C. for 30 seconds by using a hot air dryer. The coverage after drying was 20 mg/m$^2$.

| <Undercoat Solution 2-A> | |
|---|---|
| Aluminum compound (shown in Table 4 below) | 0.3 g |
| Methanol | 100 g |

TABLE 4

| | | |
|---|---|---|
| Example 11 | 2-P-1 | Aluminum isopropylate |
| Example 12 | 2-P-2 | Aluminum ethylacetoacetate diisopropylate |
| Example 13 | 2-P-3 | Aluminum tris(acetoacetate) |
| Example 14 | 2-P-4 | Cyclic aluminum oxide isopropylate |

Photosensitive Layer

In the next place, Solution [2-P] having the composition shown below was prepared and coated on the undercoated aluminum plate by a wire bar and dried at 115° C. for 45 seconds with a hot air dryer, thereby Negative-Type Lithographic Printing Plate Precursors [2-P-1] to [2-P-4] were obtained. The coverage after drying was 1.3 g/m$^2$.

| <Photosensitive Layer-Forming Solution [2-P]> | |
|---|---|
| Infrared Absorbent [IR-1] | 0.10 g |
| Radical generator (shown in Table 5 below) | 0.30 g |
| Dipentaerythritol hexaacrylate | 1.00 g |
| A 80:20 (by mol) copolymer of allyl methacrylate and methacrylic acid (weight average molecular weight: 120,000) | 1.00 g |
| Naphthalenesulfonate of Victoria Pure Blue | 0.04 g |
| Fluorine-containing surfactant (Megafac F-176, manufactured by Dainippon Chemicals & Ink Co., Ltd.) | 0.01 g |
| Methyl ethyl ketone | 9.0 g |
| Methanol | 10.0 g |
| 1-Methoxy-2 -propanol | 8.0 g |

TABLE 5

| | Radical Generator |
|---|---|
| Example 11 | ON-4 |
| Example 12 | OS-4 |
| Example 13 | ON-4 |
| Example 14 | ON-4 |

Comparative Examples 6 to 9

Negative-Type Lithographic Printing Plate Precursors [2-P-5] to [2-P-8] were manufactured and evaluated in the same manner as in Example 11 except for replacing Undercoat Layer-Forming Solution 2-A with Undercoat Layer-Forming Solution 2-B having the composition shown below. The coverage after drying of the undercoat layer was 20 mg/m$^2$.

| <Undercoat Solution 2-B> | |
|---|---|
| Compound (shown in Table 6 below) | 0.3 g |
| Methanol | 100 g |

TABLE 6

| | | |
|---|---|---|
| Comparative Example 6 | 2-P-5 | Phenylphosphonic acid |
| Comparative Example 7 | 2-P-6 | β-Alanine |
| Comparative Example 8 | 2-P-7 | Si $(O—C_2H_5)_4$ |
| Comparative Example 9 | 2-P-8 | Diazonium salt |

Exposure

Each of the thus-obtained Negative-Type Lithographic Printing Plate Precursors [2-P-1] to [2-P-4] and [2-P-5] to [2-P-8] was exposed in Trendsetter 3244VFS (manufactured by Creo), on which a water-cooling 40 W infrared semiconductor laser was mounted, under the conditions such that the output was 9 W, the outer drum rotation number was 210 rpm, the plate surface energy was 100 $mJ/cm^2$, and the resolution was 2,400 dpi.

Development Processing

After exposure, each printing plate precursor was developed with an automatic developing machine STABLON 900N manufactured by Fuji Photo Film Co., Ltd. The developer charged and the replenisher of the developer both were a 1:2 water-diluted solution of DN-3C produced by Fuji Photo Film Co., Ltd. and the unexposed area was removed to obtain a negative image. The thus-obtained lithographic printing plate was mounted on a printing press SOR-KZ manufactured by Heidelberg and used for printing.

Evaluation of Press Life

The number of sheets which could be normally printed with the above-prepared printing plates using the printing press SOR-KZ manufactured by Heidelberg was evaluated. The more the number of sheets printed, the better is the press life. The results obtained are shown in Table 7 below.

TABLE 7

| Example No. | Plate No. | Press Life | Background Staining |
|---|---|---|---|
| Example 11 | 2-P-1 | 100,000 | Good |
| Example 12 | 2-P-2 | 100,000 | Good |
| Example 13 | 2-P-3 | 100,000 | Good |
| Example 14 | 2-P-4 | 100,000 | Good |
| Comparative Example 6 | 2-P-5 | Less than 10,000 | Good |
| Comparative Example 7 | 2-P-6 | Less than 10,000 | Good |
| Comparative Example 8 | 2-P-7 | Printing was impracticable | Bad |
| Comparative Example 9 | 2-P-8 | Printing was impracticable | Bad |

It can be seen from the results in Table 7 that when a lithographic printing plate precursor having an interlayer containing the compound of Examples 11 to 14 is used, 100,000 sheets or more of good printed matters can be obtained and the press life is excellent. On the other hand, when a lithographic printing plate precursor having an interlayer containing the compound of Comparative Examples 6 and 7 is used, the image area of the plate is deteriorated before about 10,000 sheets are printed and a good printed matter cannot be obtained any more. In Comparative Examples 8 and 9, good printed matters cannot be obtained due to the generation of background staining.

According to the present invention, a lithographic printing plate precursor which can produce a printing plate directly from digital data of a computer or the like by performing the recording using a solid or semiconductor laser of radiating an infrared ray and exhibits good properties in staining performance and impression performance, can be provided.

This application is based on Japanese Patent application JP 2001-301796, filed Sep. 28, 2001, the entire content of which is hereby incorporated by reference, the same as if set forth at length.

What is claimed is:

1. A lithographic printing plate precursor comprising:

an aluminum support;

an interlayer; and a photosensitive layer in this order, wherein the aluminum support is surface-roughened and has an anodic oxide coating, the interlayer comprises a compound comprising a di- or more valent metal element, and the photosensitive layer comprises an infrared absorbent, a radical generator and a radical polymerizable compound.

2. The lithographic printing plate precursor according to claim 1, wherein the di- or more valent metal element is a di-, tri- or tetra-valent metal element.

3. The lithographic printing plate precursor according to claim 2, wherein the compound comprising a di- or more valent metal element has a dry coverage of 5 to 100 $mg/m^2$.

4. The lithographic printing plate precursor according to claim 2, wherein the compound comprising a di- or more valent metal element has a dry coverage of 10 to 50 $mg/m^2$.

5. The lithographic printing plate precursor according to claim 2, wherein the infrared absorbent is a cyanine dye represented by the following formula (I):

(I)

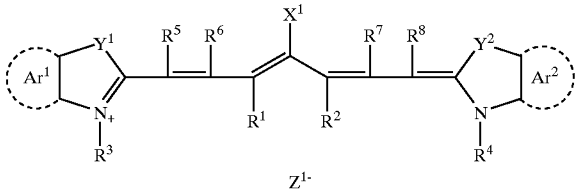

wherein $X^1$ represents a halogen atom or $X^2—L^1$, wherein $X^2$ represents an oxygen atom or a sulfur atom and $L^1$ represents a hydrocarbon group having from 1 to 12 carbon atoms; $R^1$ and $R^2$ each independently represents a hydrocarbon group having from 1 to 12 carbon atoms; $Ar^1$ and $Ar^2$ may be the same or different and each represents an aromatic hydrocarbon group which may have a substituent; $Y^1$ and $Y^2$ may be the same or different and each represents a sulfur atom or a dialkylmethylene group having 12 or less carbon atoms; $R^3$ and $R^4$ may be the same or different and each represents a hydrocarbon group having 20 or less carbon atoms, which may have a substituent; $R^5$, $R^6$, $R^7$ and $R^8$ may be the same or different and each represents a hydrogen atom or a hydrocarbon group having 12 or less carbon atoms; and $Z^{1-}$ represents a counter anion, provided that when a sulfo group is substituted to any one of $R^1$ to $R^8$, $Z^{1-}$ is not necessary.

6. The lithographic printing plate precursor according to claim 1, wherein the compound comprising a di- or more valent metal element comprises one of calcium, magnesium, strontium, barium and aluminum as a positive component.

7. The lithographic printing plate precursor according to claim 6, wherein the compound comprising a di- or more valent metal element comprises one of halogen element, nitric acid, sulfuric acid, acetic acid, phosphoric acid, hydrochloric acid, iodic acid, carbonic acid, oxygen acid, ethylenediamine tetraacetic acid, hydroxyl group, hydroxo group and hydroxyamino group as a negative component.

8. The lithographic printing plate precursor according to claim 1, wherein the compound comprising a di- or more valent metal element comprises one of halogen element, nitric acid, sulfuric acid, acetic acid, phosphoric acid, hydrochloric acid, iodic acid, carbonic acid, oxygen acid, ethylenediamine tetraacetic acid, hydroxyl group, hydroxo group and hydroxyamino group as a negative component.

9. The lithographic printing plate precursor according to claim 1, wherein the compound comprising a di- or more valent metal element has a dry coverage of 5 to 100 $mg/m^2$.

10. The lithographic printing plate precursor according to claim 1, wherein the compound comprising a di- or more valent metal element has a dry coverage of 10 to 50 $mg/m^2$.

11. The lithographic printing plate precursor according to claim 1, wherein the infrared absorbent is a cyanine dye represented by the following formula (I):

(I)

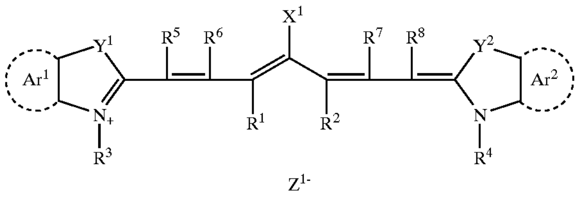

wherein $X^1$ represents a halogen atom or $X^2$—$L^1$, wherein $X^2$ represents an oxygen atom or a sulfur atom and $L^1$ represents a hydrocarbon group having from 1 to 12 carbon atoms; $R^1$ and $R^2$ each independently represents a hydrocarbon group having from 1 to 12 carbon atoms; $Ar^1$ and $Ar^2$ may be the same or different and each represents an aromatic hydrocarbon group which may have a substituent; $Y^1$ and $Y^2$ may be the same or different and each represents a sulfur atom or a dialkylmethylene group having 12 or less carbon atoms; $R^3$ and $R^4$ may be the same or different and each represents a hydrocarbon group having 20 or less carbon atoms, which may have a substituent; $R^5$, $R^6$, $R^7$ and $R^8$ may be the same or different and each represents a hydrogen atom or a hydrocarbon group having 12 or less carbon atoms; and $Z^{1-}$ represents a counter anion, provided that when a sulfo group is substituted to any one of $R^1$ to $R^8$, $Z^{1-}$ is not necessary.

12. The lithographic printing plate precursor according to claim 1 wherein the interlayer contains a hydroxide, a chloride, an acetate or a nitrate having at least one metal element selected from the group consisting of calcium and magnesium.

13. A method for plate-making of a lithographic printing plate, the method comprising: imagewise exposing the lithographic printing plate precursor according to claim 1 to an infrared laser, an ultraviolet lamp or a thermal head and developing the printing plate precursor with a developer, the lithographic printing plate precursor comprising, in this order, an aluminum support which is surface-roughened and has an anodic oxide coating, an interlayer comprising a compound of a di- or higher valent metal element, and a photosensitive layer comprising an infrared absorbent, a radical generator and a radical polymerizable compound.

* * * * *